United States Patent
Sakamoto et al.

(10) Patent No.: US 7,098,877 B2
(45) Date of Patent: Aug. 29, 2006

(54) DRIVER CIRCUIT

(75) Inventors: Hiroshi Sakamoto, Yokohama (JP); Shinji Masuda, Suginami-ku (JP)

(73) Assignee: Freescale Semiconductor, Inc., Austin, TX (US)

( * ) Notice: Subject to any disclaimer, the term of this patent is extended or adjusted under 35 U.S.C. 154(b) by 576 days.

(21) Appl. No.: 10/211,795

(22) Filed: Aug. 2, 2002

(65) Prior Publication Data

US 2003/0034803 A1 Feb. 20, 2003

(30) Foreign Application Priority Data

Aug. 15, 2001  (JP) ........................... 2001-246522

(51) Int. Cl.
  G09G 3/32   (2006.01)
  G09G 5/00   (2006.01)
  G05F 3/02   (2006.01)
  H05B 37/00  (2006.01)

(52) U.S. Cl. ................. 345/82; 345/204; 327/66; 327/530; 315/136; 315/363

(58) Field of Classification Search ............... 345/39, 345/82–84, 204, 92; 327/66, 530, 538; 315/136, 315/363

See application file for complete search history.

(56) References Cited

U.S. PATENT DOCUMENTS 6,266,929 B1    7/2001  Hauser
2002/0044008 A1 *  4/2002  Kawai et al. ............... 327/538

FOREIGN PATENT DOCUMENTS

JP   6 120809   4/1994

* cited by examiner

*Primary Examiner*—Bipin Shalwala
*Assistant Examiner*—David L. Lewis
(74) *Attorney, Agent, or Firm*—Charles E. Bergere

(57) ABSTRACT

A driver circuit that allows high-speed switching when the reference current (I) is small. The driver circuit includes a drive current generation circuit (220) for supplying to a first node (232) a drive current based on a binary data signal (DATA); a current mirror circuit (240) for conducting through a second node (234) a current (mI) having a magnitude of the current flowing through the first node (232), multiplied by a predetermined current mirror ratio (m); and a pre-bias circuit (260) for supplying a first pre-bias current (Ib1) to the first node (232) and supplying a second pre-bias current (Ib2) having a magnitude of the first pre-bias current (Ib1), multiplied by said current mirror ratio (m), to the second node (234).

7 Claims, 1 Drawing Sheet

DRIVER CIRCUIT

BACKGROUND OF THE INVENTION

The present invention relates in general to driver circuits for controlling the current flowing through an element while receiving a data signal, and more specifically to a laser diode driver circuit that allows for high-speed switching.

FIG. 1 shows a prior art driver circuit (100) used in optical communication and other fields. The driver circuit (100) includes a drive current generation circuit (120) for supplying a drive current in accordance with a data signal. The circuit (120) has a variable current source (122) having one terminal connected to a high potential side and supplying a reference current (I) from the other terminal thereof, and a switching transistor (124) for receiving the reference current (I) and generating a drive current in accordance with the data signal (DATA). The driver circuit (100) further includes a current mirror circuit (140) for conducting through a second node (134) a current having a magnitude of the current flowing through a first node (132) multiplied by a predetermined current mirror ratio. The current mirror circuit (140) has a first transistor (142) connected to the first node (132) and a second transistor (144) having a control terminal connected to the first node (132) and a control terminal of the first transistor (142), said second transistor (144) connected to the second node (134). To the second node (134) is connected a laser diode element (150) to be controlled.

In operation, the driver circuit (100) controls the current (Id) flowing through the laser diode element (150), while receiving the data signal (DATA). According to the data signal (DATA) that is a binary signal, the switching transistor (124) becomes either conductive or nonconductive. First, when the switching transistor (124) is nonconductive, no current flows through the first node (132), so that the first transistor (142) remains off. Thus, the second transistor (144) is also off, and no current flows through the second node (134) and laser diode (150). Next, when the switching transistor (124) is conductive, the reference current (I) from the variable current source (122) flows through the first node (132). Due to the nature of the current mirror circuit (140), a current (mI) having a magnitude of the reference current (I) flowing through the first node (132), multiplied by a predetermined current mirror ratio (m), flows through the laser diode (150) via the second node (134). In this way, the emitting and non-emitting states of the laser diode (150) can be switched in accordance with the binary signal (DATA).

Meanwhile, the optical output of the laser diode tends to vary significantly depending upon the operating temperature. For example, the light-emitting efficiency of the laser diode degrades as the temperature rises, so that the current conducted through the laser diode needs to be increased in order to maintain the optical output constant. Thus, to achieve a constant optical output regardless of the operating temperature, it is necessary to adjust the current (mI) conducted through the laser diode as appropriate depending upon the operating temperature. That is, it is necessary to adjust the magnitude of the reference current (I) as appropriate depending upon the operating temperature. Furthermore, in order to accommodate variability in product characteristics for laser diode elements on a unit-by-unit basis, as well as changes over time, the magnitude of the reference current (I) may be adjusted. In this context, the current source (122) is a variable current source. Thus, the magnitude of the reference current (I) is modified depending upon various factors.

However, if the reference current (I) is too small, a problem may occur. If the reference current (I) is small, the amplitude of the drive current also becomes small, so that the rise characteristics of the mirrored version (mI) of the drive current, that is, the current (Id) flowing through the laser diode (150), are degraded. Thus, there is a problem in that high-speed switching of the laser diode is difficult to achieve.

DETAILED DESCRIPTION OF THE INVENTION

The present invention is described below with reference to a specific embodiment thereof, although the present invention is not limited thereto.

Figure 1:
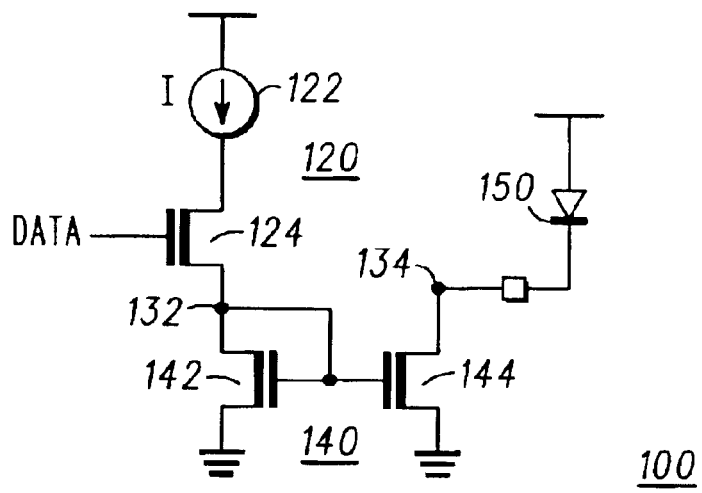
FIG. 1 is a schematic diagram of a prior art laser diode driver circuit.
Figure 2:
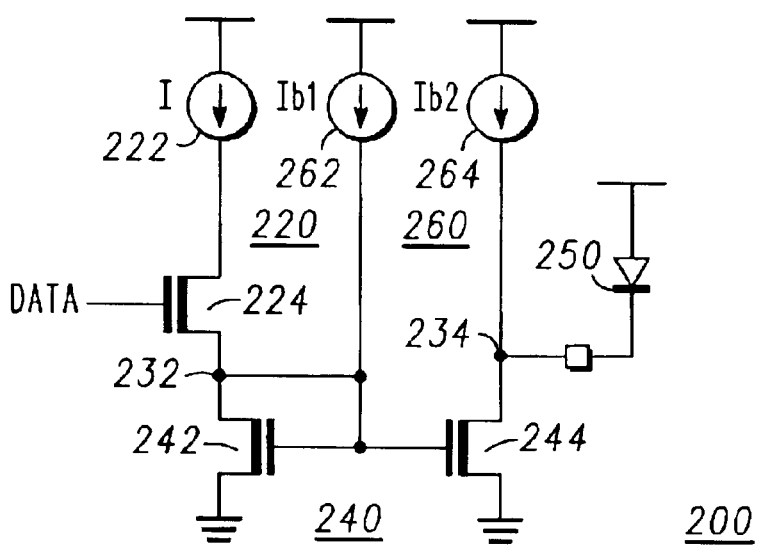
FIG. 2 is a schematic diagram of a laser diode driver circuit according to an embodiment of the present invention.

FIG. 2 shows a driver circuit (200) according to the present embodiment. The driver circuit (200) includes a drive current generation circuit (220) for generating a drive current from a reference current (I) based on a binary data signal (DATA). The circuit (220) has a reference current source (222) having one terminal connected to a high potential side and conducting a reference current (I) from the other terminal thereof. Similar to the current source (122) described in connection with FIG. 1, the current source (222) is also a variable current source. The circuit (220) further includes a switching transistor (224) having a first terminal for receiving said reference current (I), a control terminal for receiving said binary data signal (DATA), and a second terminal connected to a first node (232). The driver circuit (200) includes a current mirror circuit (240) for conducting through a second node (234) a current having a magnitude of the current flowing through the first node (232), multiplied by a predetermined current mirror ratio (m). The current mirror circuit (240) includes a first transistor (242) having a first terminal connected to the first node (232), a second terminal connected to a low potential side, and a control terminal connected to the first node (232). The current mirror circuit (240) further includes a second transistor (244) having a control terminal connected to the first node (232) and the control terminal of the first transistor (242), a first terminal connected to the second node (234), and a second terminal connected to the low potential side. A laser diode (250) to be controlled is connected to the second node (234). The driver circuit (200) further includes a pre-bias circuit (260) for supplying a first pre-bias current (Ib1) to the first node (232) and supplying a second pre-bias current (Ib2) to the second node (234). The pre-bias circuit (260) includes a first current source (262) having one terminal connected to the high potential side and supplying the first pre-bias current (Ib1) from the other terminal thereof, and a second current source (264) having one terminal connected to the high potential side and supplying the second pre-bias current (Ib2) from the other terminal thereof.

In operation, the driver circuit (200) controls the current (Id) flowing through the element (250) in accordance with the binary data signal (DATA). In accordance with the data signal (DATA), the switching transistor (224) becomes either conductive or nonconductive. First, when the switching transistor (224) is nonconductive, the reference current (I) from the reference current source (222) is not supplied to the first node (232). However, the first pre-bias current (Ib1) from the first current source (262) is supplied to the first node (232). Thus, the first transistor (242) remains conductive without being turned off. Because the total amount "Ib1" of current flows through the first node (232), the current mirror circuit (240) attempts to conduct a current equal to "m·Ib1" through the second node (234), where "m" denotes a current mirror ratio for the current mirror circuit (240). The second current source (264) is set to supply to the second node (234) with the second pre-bias current (Ib2), which is equal to "m·Ib1". Thus, when the switching transistor (224) is nonconductive, no current flows through the laser diode (250), but the current having the amount of Ib2=m·Ib1 flows through the second transistor (244).

Next, when the switching transistor (224) is conductive, the reference current (I) from the variable current source (222) is supplied to the first node (232). In this case too the first pre-bias current (Ib1) from the first current source (262) is supplied to the first node (232). Thus, the current flowing through the first node (232) is (I+Ib1). The current mirror circuit (240) attempts to conduct the current equal to "m·(I+Ib1)=m·I+m·Ib1" through the second node (234). Of that, a portion "m·Ib1" is derived by the second pre-bias current (Ib2) from the second current source (262). Thus, the current "m·I" flows through the laser diode (250). In this way, the emitting state (Id=m·I) and non-emitting state (Id=0) of the laser diode (150) are switched according to the binary signal (DATA).

According to the present embodiment, no matter whether the switching transistor (224) is conductive or not, at least the first pre-bias current (Ib1) is supplied to the first transistor (242), and at least the second pre-bias current (Ib2) is supplied to the second transistor (244). Because the first and second transistors (242 and 244) are not turned off completely, the prior art problem, i.e., the rise characteristics for a small signal, are improved. Thus, even when the reference current (I) is small, high-speed switching of the laser diode is achieved. In other words, the present embodiment achieves high-speed switching for a small signal at the expense of power consumption.

Incidentally, the prior art problem is encountered when the reference current (I) is small. Thus, if the reference current (I) is not so small, it is not always necessary to supply the first and second pre-bias currents to the current mirror circuit (240). This is because when the reference current (I) is large, high-speed switching can be done without the pre-bias current. Rather, from the standpoints of saving power and preventing transistor saturation, it is preferable to disable the pre-bias circuit (260) when the reference current (I) is large and enable the pre-bias circuit (260) only when the reference current (I) is small. That is, it is beneficial to supply said first and second pre-bias currents (Ib1 and Ib2) to the current mirror circuit (240) only when the magnitude of the reference current (I) is smaller than a predetermined value, and otherwise disable the pre-bias circuit (260). It is also beneficial to make the first and second pre-bias currents (Ib1 and Ib2) smaller in a sequential or stepwise manner as the reference current (I) becomes larger.

What is claimed is:

1. A driver circuit for controlling a current (Id) flowing through an element in accordance with a binary data signal (DATA), said driver circuit comprising:

a drive current generation circuit for supplying to a first node a drive current based on said binary data signal (DATA);

a current mirror circuit, connected to the drive current generation circuit by way of said first node, for conducting through a second node a current (mI) having a magnitude of the current flowing through said first node multiplied by a predetermined current mirror ratio (m); and a pre-bias circuit having a first current supply connected to said first node for supplying a first pre-bias current (Ib1) to said first node and a second current supply connected to said second node for supplying to said second node a second pre-bias current (Ib2) having a magnitude of said first pre-bias current (Ib1), multiplied by said current mirror ratio (m);

whereby the current (Id) flowing through the element, which is connected to said second node, is controlled.

2. A driver circuit for controlling a current (Id) flowing through an element in accordance with a binary data signal (DATA), said driver circuit comprising:

a drive current generation circuit for generating a drive current from a reference current (I) based on said binary data signal (DATA), said drive current generation circuit including: a reference current source having one terminal connected to a high potential side and conducting the reference current (I) from the other terminal thereof, and a switching transistor, connected between the reference current source and a first node, receiving said reference current (I) and generating said drive current in accordance with said binary data signal (DATA);

a current mirror circuit for conducting through a second node a current having a magnitude of the current flowing through said first node multiplied by a predetermined current mirror ratio (m), said current mirror circuit including: a first transistor connected to said first node; and a second transistor having a control terminal connected to said first node and the control terminal of said first transistor, said second transistor connected to said second node; and a pre-bias circuit for supplying a first pre-bias current (Ib1) to said first node and supplying a second pre-bias current (Ib2) to said second node said pre-bias circuit including: a first current source (262) having one terminal connected to the high potential side and another terminal connected to said first node and supplying the first pre-bias current (Ib1) from the other terminal thereof; and a second current source having one terminal connected to the high potential side and another terminal connected to said second node and supplying the second pre-bias current (Ib2) from the other terminal thereof to said second node;

whereby the current (Id) flowing trough the element, which is connected to said second node (234), is controlled.

3. The driver circuit according to claim 1, wherein the second pre-bias current (Ib2) is equal to a current (m·Ib1) having a magnitude of said first pre-bias current (Ib1) multiplied by said current mirror ratio (m).

4. The driver circuit according to claim 1, wherein the element connected to said second node is a laser diode element.

5. The driver circuit according to claim 1, wherein the magnitudes of said first and second pre-bias currents (Ib1 and Ib2) are varied in accordance with the magnitude of a reference current (I).

6. The driver circuit according to claim 5, wherein said pre-bias circuit is enabled when the magnitude of said reference current (I) is smaller than a predetermined value, and is disabled when it is larger than the predetermined value.

7. The driver circuit according to claim 1, wherein said first and second pre-bias currents (Ib1 and Ib2) are controlled so that they become smaller in a sequential or stepwise manner as a reference current (I) increases.

* * * * *